US012638706B2

(12) United States Patent
Gu et al.

(10) Patent No.: US 12,638,706 B2
(45) Date of Patent: May 26, 2026

(54) DISPLAY PANEL AND MANUFACTURING METHOD THEREOF

(71) Applicant: SUZHOU CHINA STAR OPTOELECTRONICS TECHNOLOGY CO., LTD., Suzhou (CN)

(72) Inventors: Xin Gu, Suzhou (CN); Baibo Yu, Suzhou (CN); Junjie Li, Suzhou (CN); Bangyin Peng, Suzhou (CN); Dan Cao, Suzhou (CN)

(73) Assignee: SUZHOU CHINA STAR OPTOELECTRONICS TECHNOLOGY CO., LTD., Suzhou (CN)

( * ) Notice: Subject to any disclaimer, the term of this patent is extended or adjusted under 35 U.S.C. 154(b) by 1184 days.

(21) Appl. No.: 17/623,574

(22) PCT Filed: Dec. 27, 2021

(86) PCT No.: PCT/CN2021/141457
§ 371 (c)(1),
(2) Date: Jun. 29, 2023

(87) PCT Pub. No.: WO2023/115595
PCT Pub. Date: Jun. 29, 2023

(65) Prior Publication Data
US 2024/0045249 A1     Feb. 8, 2024

(30) Foreign Application Priority Data
Dec. 21, 2021     (CN) .......................... 202111568838.7

(51) Int. Cl.
*G02F 1/1333* (2006.01)
*G02F 1/1335* (2006.01)
(Continued)

(52) U.S. Cl.
CPC .. *G02F 1/133354* (2021.01); *G02F 1/133514* (2013.01); *H10D 86/441* (2025.01); *H10D 86/60* (2025.01); *G02F 2201/56* (2013.01)

(58) Field of Classification Search
CPC ......... G02F 1/133354; G02F 1/133514; G02F 2201/56; H10D 86/441; H10D 86/60
(Continued)

(56) References Cited

U.S. PATENT DOCUMENTS

2016/0366379 A1    12/2016  Hickl
2017/0322435 A1*   11/2017  Yi ......................... G02F 1/1333
(Continued)

FOREIGN PATENT DOCUMENTS

CN          206470509 U       9/2017
CN          110277018 A       9/2019
(Continued)

OTHER PUBLICATIONS

International Search Report in International application No. PCT/CN2021/141457, mailed on May 27, 2022.
(Continued)

*Primary Examiner* — David Y Chung
(74) *Attorney, Agent, or Firm* — PV IP PC; Chrisopher S. Ruprecht; Wei Te Chung

(57)          ABSTRACT

The present invention provides a display panel and the manufacturing method thereof. The display panel includes an array substrate, a color filter substrate, and a bonding terminal. The array substrate has a first surface, a second surface, and a side surface connecting the first surface and the second surface. A side surface of the array substrate includes a first connection surface. The first connection surface is a curved surface. The color filter substrate and the bonding terminal are disposed on the first surface of the array substrate. The side surface of the color filter substrate
(Continued)

intersects a surface of the color filter substrate away from the array substrate to form a first included angle, and the first included angle is an acute angle or a right angle.

17 Claims, 4 Drawing Sheets

(51) Int. Cl.
　　*H10D 86/40*　　　(2025.01)
　　*H10D 86/60*　　　(2025.01)
(58) Field of Classification Search
　　USPC ......................................................... 349/149
　　See application file for complete search history.

(56) References Cited

U.S. PATENT DOCUMENTS

2022/0020779 A1 *　1/2022　Wei ........................ H10D 86/60
2022/0236600 A1 *　7/2022　Zhang ................. G02F 1/13458

FOREIGN PATENT DOCUMENTS

| CN | 110579916 | A | 12/2019 |
|----|-----------|---|---------|
| CN | 110673409 | A | 1/2020 |
| CN | 110967881 | A | 4/2020 |
| CN | 111679523 | A | 9/2020 |
| CN | 112764257 | A | 5/2021 |
| CN | 112782885 | A | 5/2021 |
| CN | 112904610 | A | 6/2021 |
| CN | 113419376 | A | 9/2021 |
| JP | H0922022 | A | 1/1997 |
| KR | 101955595 | B1 | 3/2019 |

OTHER PUBLICATIONS

Written Opinion of the International Search Authority in International application No. PCT/CN2021/141457,mailed on May 27, 2022.
Chinese Office Action issued in corresponding Chinese Patent Application No. 202111568838.7 dated Dec. 26, 2022, pp. 1-7.
Chinese Office Action issued in corresponding Chinese Patent Application No. 202111568838.7 dated May 17, pp. 1-8.

* cited by examiner

DISPLAY PANEL AND MANUFACTURING METHOD THEREOF

FIELD OF INVENTION

The present invention relates to a field of display apparatuses, especially to a display panel and a manufacturing method thereof.

BACKGROUND OF INVENTION

For curved frame-less liquid crystal display (LCD) products, strength and lifespan of the liquid crystal display panel are the most important quality issue. To improve a strength of curved products, usually a semi-circular end surface grinding process is used. However, the semi-circular grinding process increases a grinded surface of a terminal portion and easily generate remaining metal foreign residues to result in shorting of wirings in the display panel. In the meantime, the semi-circular process would also result in that a side surface of the display panel cannot be encapsulated and bubbles occur, which severely influences a yield rate and a cost.

SUMMARY OF INVENTION

Technical Issue

An objective of the present invention is to provide a display panel and the manufacturing method thereof to solve a technical issue that a conventional display panel grinding technology makes metal foreign residues remain in the display panel and results in shoring of wirings in the display panel such that a side surface of the display panel cannot be encapsulated and bubbles occur.

Technical Solution

To achieve the above objective, the present invention provides a display panel, the display panel comprises a display region and a bonding region connected to the display region, and the display panel comprising a display surface; wherein the display panel comprises an array substrate, a color filter substrate, and a bonding terminal. The array substrate comprises a first surface and a second surface disposed oppositely, and a side surface connecting the first surface and the second surface. The color filter substrate is disposed on the first surface of the array substrate and located in the display region. The bonding terminal is disposed on the first surface of the array substrate and located in the bonding region. A side surface of the color filter substrate intersects a surface of the color filter substrate away from the array substrate to form a first included angle, and the first included angle is an acute angle or a right angle.

Furthermore, a side surface of the bonding terminal intersects a surface of the bonding terminal away from the array substrate to form a second included angle, and the second included angle is an acute angle or a right angle.

Furthermore, the side surface of the array substrate further comprises:

a first connection surface, the first connection surface is curved surface. The first surface and the second surface are connected to straight edges of the side surface of the array substrate.

Furthermore, the side surface of the array substrate further comprises a second connection surface. The second connection surface is a plane and is disposed at an end of the first connection surface near the first surface. An end of the second connection surface is connected to the display surface, and another end of the second connection surface is connected to a straight edge of the first connection surface. The second connection surface and the side surface of the color filter substrate and/or a side surface of the bonding terminal are in a same plane.

Furthermore, the side surface of the color filter substrate and a side surface of the bonding terminal are tangent to the first connection surface.

Furthermore, the side surface further comprises a third connection surface. The third connection surface is a plane, and is disposed at an end of the first connection surface near the second surface. An end of the third connection surface is connected to the second surface, and another end of the third connection surface is connected to a straight edge of the first connection surface. The third connection surface intersects the second surface to form a third included angle, and the third included angle is an obtuse angle.

Furthermore, the third connection surface is tangent to the first connection surface.

Furthermore, the curved surface is a circular arc surface or an elliptical circular arc surface, or is formed by a combination of at least two arc surfaces with different circle centers.

Furthermore, the display panel further comprises a side encapsulation layer and a polarizer. The side encapsulation layer is disposed on the array substrate and the side surface of the color filter substrate and located in the display region. The polarizer disposed on the surface of the color filter substrate away from the array substrate.

The present invention further provides a display panel manufacturing method, the display panel manufacturing method comprises steps as follows: providing an array substrate; forming a color filter substrate on the array substrate in a display region; forming a bonding terminal on the array substrate in a bonding region; and by a grind device grinding a side surface of the color filter substrate such that the side surface of the color filter substrate intersects a surface of the color filter substrate away from the array substrate to form a first included angle, wherein the first included angle is an acute angle or a right angle.

Furthermore, the display panel manufacturing method further comprises a step as follows: by the grind device grinding a side surface of the bonding terminal such that the side surface of the bonding terminal intersects a surface of the bonding terminal away from the array substrate to form a second included angle, wherein the second included angle is an acute angle or a right angle.

Advantages

Advantages of the present invention are as follows: The display panel and the manufacturing method thereof of the present invention, change a grind shape of the side surface, combine advantages of a curved surface (the side surface of the array substrate) and a plane (side surfaces of the color filter substrate and the bonding terminal), add the advantage brought by the plane while keeping the advantage of the arc side surface, prevent a metal material in the bonding terminal from becoming particle foreign residues remaining in the display panel due to grinding, to further solve an issue shorting of conductive wirings in the display panel resulting from the metal foreign residues, and also prevent an issue that a side surface of the display panel cannot be encapsulated and bubbles occur. In the meantime, flow and filling of the side encapsulation layer material is more convenient, which reduces an infiltrating time of the photosensitive glue material before the ultraviolet curing lamp arrives in, and improves a coating speed of the photosensitive glue material to improve production efficiency.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

Figure 1:
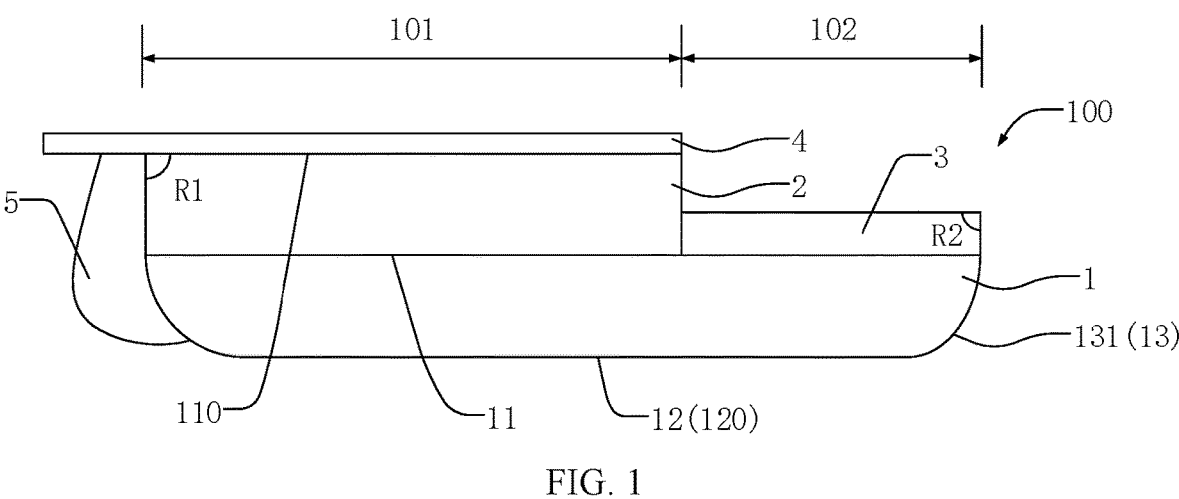
FIG. 1 is a schematic structural view of a lamination of a display panel of a first embodiment of the present invention.

Reference numerals of elements in the figures are as follows:

display panel 100; display region 101;

bonding region 102; display surface 110;

rear surface 120; array substrate 1;

first surface 11; second surface 12; side surface 13; first connection surface 131;

second connection surface 132; third connection surface 133;

color filter substrate 2; first included angle R1;

bonding terminal 3; second included angle R2;

polarizer 4; side encapsulation layer 5;

grind head 200; grind surface 210.

DETAILED DESCRIPTION OF PREFERRED EMBODIMENTS

The preferred embodiments of the present invention are described below with reference to the accompanying drawings, which are used to exemplify the embodiments of the present invention to a person of ordinary skill in the art to make the technical contents of the present invention clearer and easy to understand. However, the present invention may be embodied in many different forms of embodiments, and the scope of the invention is not limited to the embodiments mentioned herein.

In the drawings, elements with the same structures are indicated with the same numerals, and elements with similar structures or functions are indicated with similar numerals. Furthermore, for convenience of understanding and description, the dimension and thickness of each assembly in the drawings are depicted at arbitrarily, and the present invention has no limit to the dimension and thickness of each assembly. To make the drawings more clear, thicknesses of some portions of some elements in the attached drawings are suitably exaggerated.

Furthermore, Each of the following embodiments is described with appending figures to illustrate specific embodiments of the present invention that are applicable. The terminologies of direction mentioned in the present invention, such as "upper", "lower", "front", "rear", "left", "right", "inner", "outer", "side surface", etc., only refer to the directions of the appended figures. Therefore, the used terminologies of direction are for better and clearer explanation and understanding of the present invention, instead of indicating or implying that the referred device or element must has a specific orientation, or be structured or operate with a specific orientation. Therefore, they should not be understood as limitations to the present invention. Furthermore, terminologies "first", "second" are only for the purposes of description, and cannot be understood as indication or implication of comparative importance or a number of technical features.

When some elements are described to be "on" another element, the element can be disposed directly on the another element; alternatively, the element can has an intervening element, the element is disposed on the intervening element, and the intervening element is disposed on the another element when an element are described to be "installed on" or "connected to" another element, both descriptions can be understood as directly "installed" or "connected", or as one element "installed on" or "connected to" another element through an intervening element.

First Embodiment

The embodiment of the present invention provides a display device. The display device is a curved liquid crystal display (LCD). The display device generally comprises a display panel 100 and a backlight module. The backlight module provides the display panel 100 with a display light source. The display device can be any display device including a display function such as a cell phone, a notebook, a tablet, or a television.

With reference to FIG. 1, the display panel 100 comprises a display region 101 and a bonding region 102 connected to the display region 101. The display panel 100 comprises an array substrate 1, a color filter substrate 2, and a bonding terminal 3.

The array substrate 1 covers the display region 101 and the bonding region 102, and thin film transistors, signal wirings, etc. are generally disposed on the array substrate 1. The array substrate 1 comprises a first surface 11 and a second surface 12 disposed oppositely. The first surface 11 and the second surface 12 are connected to each other through a side surface 13. The thin film transistors are arranged in an array in the array substrate 1, and are located in the display region 101. The array substrate 1 controls an intensity of a driving electrical field through the thin film transistors to control rotation angles of liquid crystals in the display panel 100, and to further control a light transmittance of each pixel unit such that the display panel 100 can display different images.

The side surface 13 of the array substrate 1 comprises a first connection surface 131. The first connection surface 131 is a curved surface. The curved surface can be circular arc-shaped or elliptical arc-shaped, and a radian of the curved surface is less than or equal to 90°. The first connection surface 131 two straight edges disposed oppositely, and the first surface 11 and the second surface 12 are connected to the straight edges respectively. Furthermore, the second surface 12 is tangent to the first connection surface 131 such that a junction between the second surface 12 and the first connection surface 131 is more natural and smooth. At this time, the first connection surface 131 is the side surface 13 of the array substrate 1. The side surface 13 of the array substrate 1 including the curved surface structure can lower a stress generated during bending formation of the display panel 100 and effectively remove micro cracks generated after the display panel is cut.

The bonding terminal 3 is disposed on a first surface 11 of the array substrate 1 and is located in the bonding region 102. The bonding terminal 3 is configured to electrically connect the array substrate 1 to an external driver element (for example, a chip on film). The thin film transistors in the array substrate 1 is electrically connected to the bonding terminal 3 through the signal wiring. The external driver element controls and driver signals to the thin film transistors for switch on or off through the bonding terminal 3 and the signal wirings.

The color filter substrate 2 is also disposed on the first surface 11 of the array substrate 1 and is located in the display region 101. The color filter substrate 2 generally comprises a color resist layer, a black matrix, etc. Backlight light through the array substrate 1 and liquid crystals becomes light of a specific color after filtered by the color resist layer to achieve color display. The black matrix is configured to prevent cross color of light between adjacent pixel units to further enhance contrast of display images.

The display panel 100 comprises a display surface 110 and a rear surface 120. A surface of the color filter substrate 2 away from the array substrate 1 is the display surface 110 of the display panel 100. The second surface 12 of the array substrate 1 is the rear surface 120 of the display panel 100. Light emitted by the backlight module enters the display panel 100 through the rear surface 120. The backlight light of a unified color after refraction and filtering of devices in the display panel 100, becomes light of colors and is emitted out from the display surface 110 to form the display images.

In the display region 101, the side surface 13 of the array substrate 1 is assembled with a side surface of the color filter substrate 2 to form a side surface of the display panel 100. Namely, the side of the color filter substrate 2 near the array substrate 1 is jointed with a straight edge of the first connection surface 131 away from the rear surface 120. The side surface of the color filter substrate 2 is tangent to the first connection surface 131 such that a junction between the side surface of the color filter substrate 2 and the first connection surface 131 is more smooth and natural. A first included angle R1 is defined between the side surface of the color filter substrate 2 and the display surface 110, and the first included angle R1 is an acute angle or a right angle.

In the bonding region 102, the side surface 13 of the array substrate 1 is assembled with a side surface of the bonding terminal 3 to form the side surface of the display panel 100. Namely, a side of the side surface of the bonding terminal 3 near the array substrate 1 is jointed with a straight edge of the first connection surface 131 away from the rear surface 120. The side surface of the bonding terminal 3 is tangent to the first connection surface 131 such that a junction between the side surface of the bonding terminal 3 and the first connection surface 131 is more smooth and natural. A second included angle R2 is defined between the side surface of the bonding terminal 3 and a surface of the bonding terminal 3 away from the array substrate 1, and the second included angle R2 is an acute angle or a right angle.

Preferably, both the first included angle R1 and the second included angle R2 are right angles. At this time, a radian of the first connection surface 131 is 90°.

The display panel 100 further comprises a polarizer 4 and a side encapsulation layer 5. With reference to FIG. 1, the polarizer 4 is disposed on the surface of the color filter substrate 2 away from the array substrate 1, and a width of the polarizer 4 is greater than a width of the color filter substrate 2. The side encapsulation layer 5 is disposed in the display region 101 and covers the side surface 13 of the array substrate 1 and a side surface of the color filter substrate 2. The side encapsulation layer 5 and the color filter substrate 2 are commonly disposed on the same side of the polarizer 4, and a thickness of the side encapsulation layer 5 is less than or equal to a sum of a thickness of the array substrate 1 and a thickness of the color filter substrate 2. The side encapsulation layer 5 is configured to encapsulate the side surface of the display panel 100 to prevent water oxygen from invading through the side surface of the display panel 100 and improve a use lifespan of the display panel 100.

Figure 2:
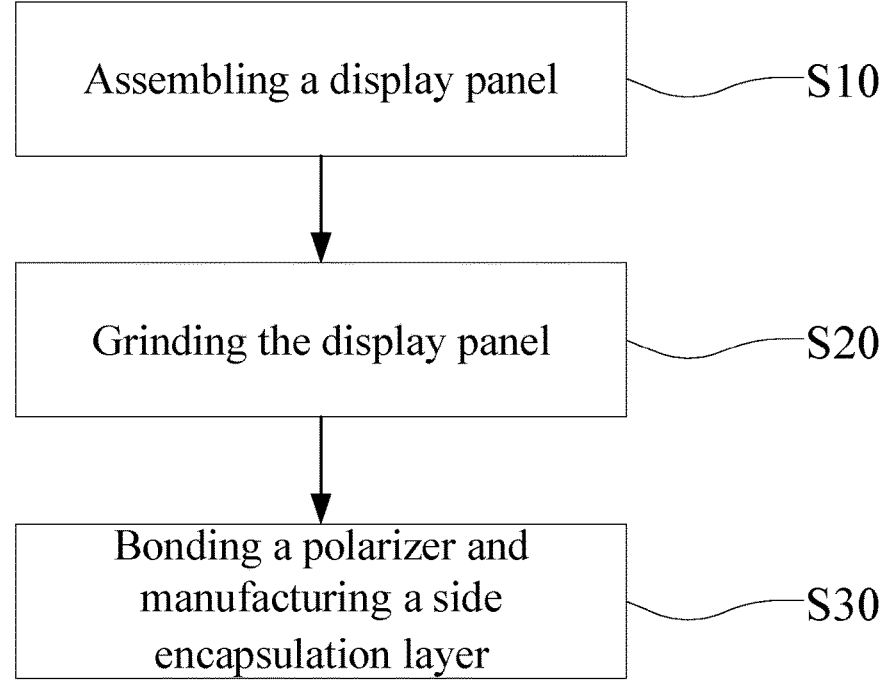
FIG. 2 is a schematic flowchart of a display panel manufacturing method of the first embodiment of the present invention.

The embodiment of the present invention also provides a manufacturing method of a display panel 100 for manufacturing the above display panel 100. Specific processes in the manufacturing method, as shown in FIG. 2, comprise steps follows:

A step S10) comprises assembling a display panel 100: An array substrate 1 is provided. In a bonding region 102, a bonding terminal 3 is manufactured on the first surface 11 of the array substrate 1. In a display region 101, a color filter substrate 2 is assembled on the first surface 11 of the array substrate 1.

Figure 3:
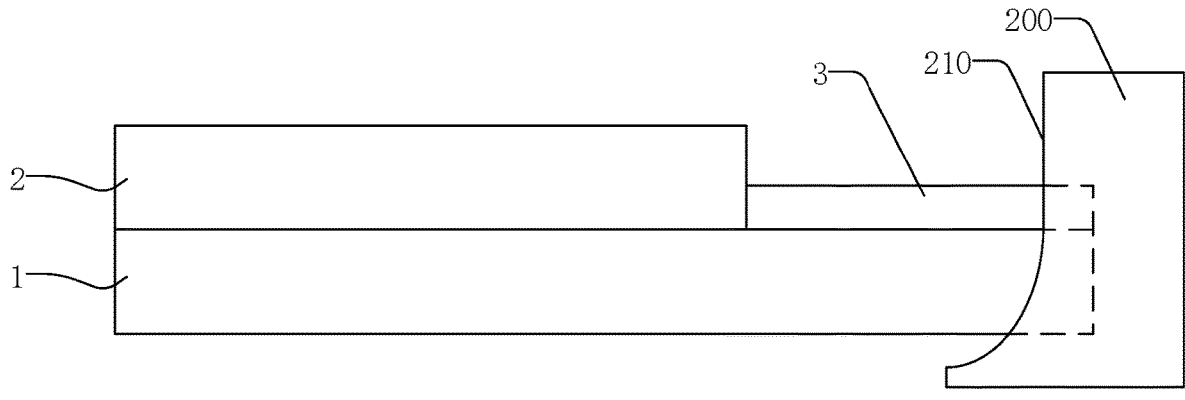
FIG. 3 is a schematic view of grinding in a step S30 of the first embodiment of the present invention.

A step S20) comprises grinding the display panel 100: With reference to FIG. 3, a grind device is prepared, the side surface of the display panel 100 is grinded by the grind device to grind the side surface 13 of the array substrate 1 to an arc surface, and a frame region of the display panel 100 unable to display images is reduced to achieve narrow frame display.

In particular, the grind device comprises a grind head 200. With reference to FIG. 3, the grind head 200 comprises a grind surface 210. When the grind device operates, the grind surface 210 contacts an object to be grinded and performs a grinding operation. The grind surface 210 comprises a curved grinding surface and a first grinding surface. The first grinding surface corresponds to the side surface of the color filter substrate 2, the curved grinding surface corresponds to the side surface 13 of the array substrate 1 and an included angle between a rear surface 120 of the display panel 100 and the side surface 13.

Figure 4:
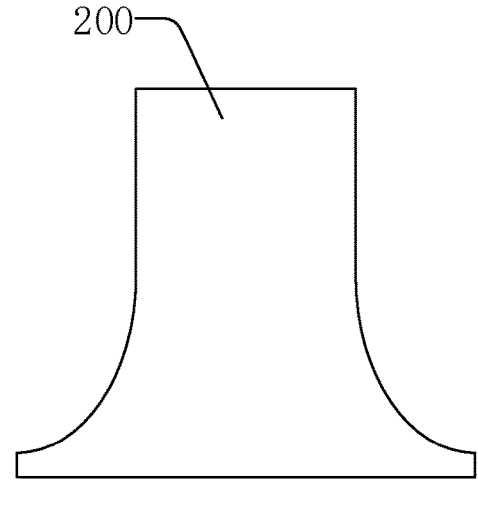
FIG. 4 is a schematic cross-sectional view of a roller grind head of the first embodiment of the present invention.

Furthermore, a cross-section of the grind head 200 can be a prismatic structure as shown in FIG. 3, and the cross-section can also be a roller structure as shown in FIG. 4. The grind head 200 of the prismatic structure can be adapted for a grind device moving grinding back and forth along a fixing direction or a grind device grinding by rotating a product. A roller grind head 200 is adapted for a grind device grinding by rotating the grind head 200.

A step S30) comprises bonding a polarizer 4 and manufacturing a side encapsulation layer 5:

A polarizer 4 is prepared, and the polarizer 4 is bonded to a the surface of the color filter substrate 2 away from the array substrate 1. In the display region 101, a photosensitive glue layer is coated on the array substrate 1 and the side surface of the color filter substrate 2, and the photosensitive glue layer is cured by irradiation of ultraviolet to form a side encapsulation layer 5. The array substrate 1, the color filter substrate 2, the polarizer 4, and the side encapsulation layer 5 are assembled to form the display panel 100 as shown in FIG. 1.

In the display panel and the manufacturing method thereof provided by the embodiment of the present invention, grind shapes of the side surfaces are changed, advantages of a curved surface (the side surface of the array substrate) and a plane (the side surfaces of the color filter substrate and the bonding terminal) are combined, and the advantage of a plane is added while the advantage of the arc side surface is reserved.

First, a surface of the bonding terminal away from the array substrate would not be contacted when the grind head is grinded, which reduces a contact area between the bonding terminal and the grind head and makes the bonding terminal receive a force more evenly during grinding to prevent a metal material in the bonding terminal from becoming particle foreign residues remaining in the display panel due to grinding, to further solve an issue shorting of conductive wirings in the display panel resulting from the metal foreign residues.

Second, a design of the plane side surface of the color filter substrate is reserved, which more facilitates flow and filling of a photosensitive glue material, solves the issue that in a conventional technology the photosensitive glue material cannot be filled into an arc gap and results in a side-coated white line, reduces an infiltrating time of the photosensitive glue material before the ultraviolet curing lamp arrives in, and improves a coating speed of the photosensitive glue material to improve production efficiency.

Second Embodiment

The embodiment of the present invention provides a display device. The display device is a curved liquid crystal display (LCD). The display device generally comprises a display panel 100 and a backlight module. The backlight module provides the display panel 100 with a display light source. The display device can be any display device including a display function such as a cell phone, a notebook, a tablet, or a television.

Figure 5:
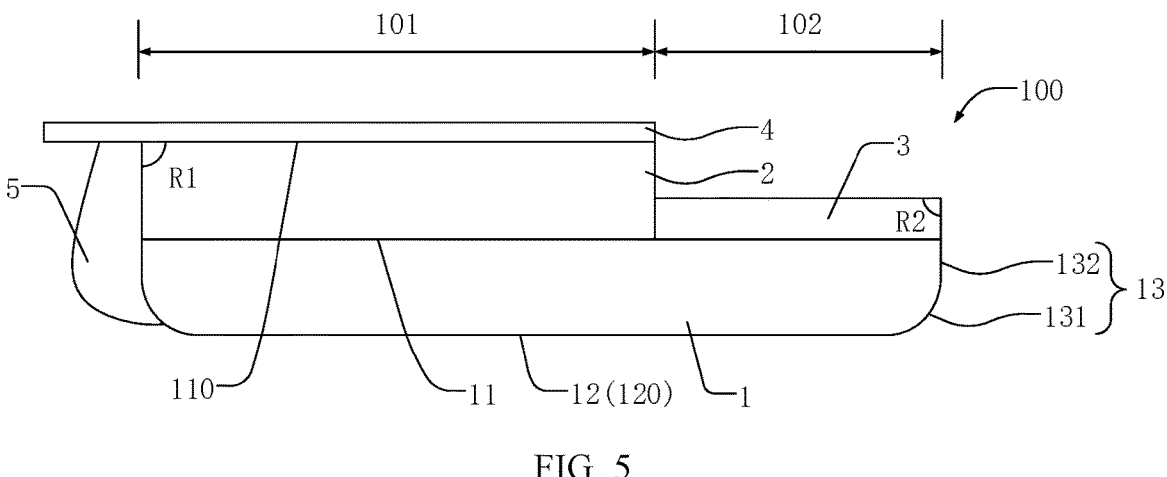
FIG. 5 is a schematic structural view of a lamination of the display panel of a second embodiment of the present invention.

With reference to FIG. 5, the display panel 100 comprises a display region 101 and a bonding region 102 connected to the display region 101. The display panel 100 comprises an array substrate 1, a color filter substrate 2, and a bonding terminal 3.

The array substrate 1 covers the display region 101 and the bonding region 102, and thin film transistors, signal wirings, etc. are generally disposed on the array substrate 1. The array substrate 1 comprises a first surface 11 and a second surface 12 disposed oppositely. The first surface 11 and the second surface 12 are connected to each other through a side surface 13. The thin film transistors are arranged in an array in the array substrate 1, and are located in the display region 101. The array substrate 1 controls an intensity of a driving electrical field through the thin film transistors to control rotation angles of liquid crystals in the display panel 100, and to further control a light transmittance of each pixel unit such that the display panel 100 can display different images.

The side surface 13 of the array substrate 1 comprises a first connection surface 131 and a second connection surface 132. The first connection surface 131 is a curved surface, and the second connection surface 132 is a plane. The curved surface can be circular arc-shaped, elliptical arc-shaped, or is a combination of at least two arc surfaces with different circle centers, and a radian of the curved surface is less than or equal to 90°. The first connection surface 131 comprises two straight edges disposed oppositely. The second surface 12 is connected to a straight edge of the first connection surface 131. A side of the second connection surface 132 is connected to the first surface 11, and a side of the second connection surface 132 away from the first surface 11 is connected to a straight edge of the first connection surface 131 away from the second surface 12. Both the second surface 12 and the second connection surface 132 are tangent to the first connection surface 131 such that a junction of the second surface 12 and the second connection surface 132 with the first connection surface 131 is more natural and smooth. The side surface 13 of the array substrate 1 including the curved surface structure can lower a stress during bending formation of the display panel 100 and effectively remove micro cracks generated on the display panel after cutting.

The bonding terminal 3 is disposed on a first surface 11 of the array substrate 1 and is located in the bonding region 102. The bonding terminal 3 is configured to electrically connect the array substrate 1 to an external driver element (for example, a chip on film). The thin film transistors in the array substrate 1 is electrically connected to the bonding terminal 3 through the signal wiring. The external driver element controls and driver signals to the thin film transistors for switch on or off through the bonding terminal 3 and the signal wirings.

The color filter substrate 2 is also disposed on the first surface 11 of the array substrate 1 and is located in the display region 101. The color filter substrate 2 generally comprises a color resist layer, a black matrix, etc. Backlight light through the array substrate 1 and liquid crystals becomes light of a specific color after filtered by the color resist layer to achieve color display. The black matrix is configured to prevent cross color of light between adjacent pixel units to further enhance contrast of display images.

The display panel 100 comprises a display surface 110 and a rear surface 120. A surface of the color filter substrate 2 away from the array substrate 1 is the display surface 110 of the display panel 100. The second surface 12 of the array substrate 1 is the rear surface 120 of the display panel 100. Light emitted by the backlight module enters the display panel 100 through the rear surface 120. The backlight light of a unified color after refraction and filtering of devices in the display panel 100, becomes light of colors and is emitted out from the display surface 110 to form the display images.

In the display region 101, the side surface 13 of the array substrate 1 and the side surface of the color filter substrate 2 are assembled to form the side surface of the display panel 100, namely a side of the side surface of the color filter substrate 2 near the array substrate 1 is jointed with a side of the second connection surface 132 away from the first connection surface 131. The side surface of the color filter substrate 2 is tangent to the first connection surface 131, namely, the side surface of the color filter substrate 2 and the second connection surface 132 are in a same plane. A first included angle R1 is defined between the side surface of the color filter substrate 2 and the display surface 110, and the first included angle R1 is an acute angle or a right angle.

In the bonding region 102, the side surface 13 of the array substrate 1 is assembled with a side surface of the bonding terminal 3 to form the side surface of the display panel 100. Namely, a side of the side surface of the bonding terminal 3 near the array substrate 1 is jointed with a side of the second connection surface 132 away from the first connection surface 131. The side surface of the bonding terminal 3 is tangent to the first connection surface 131, and the side surface of the bonding terminal 3 and the second connection surface 132 are in a same plane. A second included angle R2 is defined between the side surface of the bonding terminal 3 and a surface of the bonding terminal 3 away from the array substrate 1, and the second included angle R2 is an acute angle or a right angle.

Preferably, both the first included angle R1 and the second included angle R2 are right angles. At this time, the radian of the first connection surface 131 is 90°.

The display panel 100 further comprises a polarizer 4 and a side encapsulation layer 5. With reference to FIG. 5, the polarizer 4 is disposed on the surface of the color filter substrate 2 away from the array substrate 1, and a width of the polarizer 4 is greater than a width of the color filter substrate 2. The side encapsulation layer 5 is disposed in the display region 101 and covers the side surface 13 of the array substrate 1 and a side surface of the color filter substrate 2. The side encapsulation layer 5 and the color filter substrate 2 are commonly disposed on the same side of the polarizer 4, and a thickness of the side encapsulation layer 5 is less than or equal to a sum of a thickness of the array substrate 1 and a thickness of the color filter substrate 2. The side encapsulation layer 5 is configured to encapsulate the side surface of the display panel 100 to prevent water oxygen from invading through the side surface of the display panel 100 and improve a use lifespan of the display panel 100.

The embodiment of the present invention also provides a manufacturing method of a display panel 100 for manufacturing the above display panel 100. Specific processes of the manufacturing method are the same as those in the display panel manufacturing method provided by the first embodiment, and a difference is the grind device for grinding the display panel 100. The grind device used by the embodiment of the present invention has a first grinding surface on the grind head not only corresponding to the side surface of the color filter substrate 2 and the side surface of the bonding terminal 3 but also corresponding to the second connection surface 132 of the array substrate 1, and grinds the second connection surface 132 while grinding the side surface of the color filter substrate 2 and the side surface of the bonding terminal 3.

In the display panel and the manufacturing method thereof provided by the embodiment of the present invention, grind shapes of the side surfaces are changed, advantages of a curved surface (the side surface of the array substrate) and a plane (the side surfaces of the color filter substrate and the bonding terminal) are combined, and the advantage of a plane is added while the advantage of the arc side surface is reserved.

First, a surface of the bonding terminal away from the array substrate would not be contacted when the grind head is grinded, which reduces a contact area between the bonding terminal and the grind head and makes the bonding terminal receive a force more evenly during grinding to prevent a metal material in the bonding terminal from becoming particle foreign residues remaining in the display panel due to grinding, to further solve an issue shorting of conductive wirings in the display panel resulting from the metal foreign residues.

Second, a design of the plane side surface of the color filter substrate is reserved, which more facilitates flow and filling of a photosensitive glue material, solves the issue that in a conventional technology the photosensitive glue material cannot be filled into an arc gap and results in a side-coated white line, reduces an infiltrating time of the photosensitive glue material before the ultraviolet curing lamp arrives in, and improves a coating speed of the photosensitive glue material to improve production efficiency.

Third Embodiment

The embodiment of the present invention provides a display device. The display device is a curved liquid crystal display (LCD). The display device generally comprises a display panel 100 and a backlight module. The backlight module provides the display panel 100 with a display light source. The display device can be any display device including a display function such as a cell phone, a notebook, a tablet, or a television.

Figure 6:
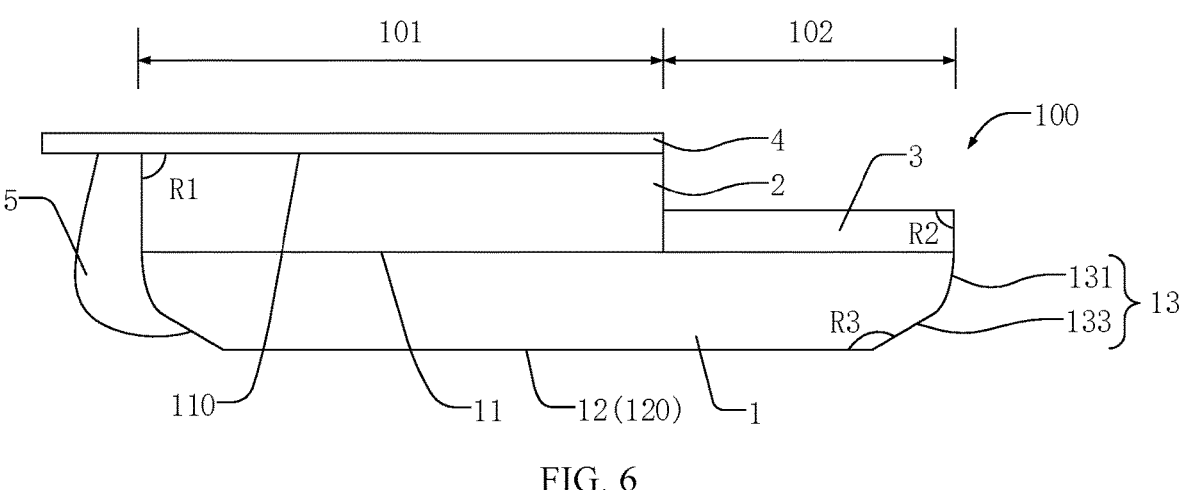
FIG. 6 is a schematic structural view of a lamination of the display panel of a third embodiment of the present invention.

With reference to FIG. 6, the display panel 100 comprises a display region 101 and a bonding region 102 connected to the display region 101. The display panel 100 comprises an array substrate 1, a color filter substrate 2, and a bonding terminal 3.

The array substrate 1 covers the display region 101 and the bonding region 102, and thin film transistors, signal wirings, etc. are generally disposed on the array substrate 1. The array substrate 1 comprises a first surface 11 and a second surface 12 disposed oppositely. The first surface 11 and the second surface 12 are connected to each other through a side surface 13. The thin film transistors are arranged in an array in the array substrate 1, and are located in the display region 101. The array substrate 1 controls an intensity of a driving electrical field through the thin film transistors to control rotation angles of liquid crystals in the display panel 100, and to further control a light transmittance of each pixel unit such that the display panel 100 can display different images.

The side surface 13 of the array substrate 1 comprises a first connection surface 131 and a third connection surface 133. The first connection surface 131 is a curved surface, and the third connection surface 133 is a plane. The curved surface can be circular arc-shaped, elliptical arc-shaped, or is a combination of at least two arc surfaces with different circle centers, and a radian of the curved surface is less than or equal to 90°. The first connection surface 131 comprises two straight edges disposed oppositely. The first surface 11 is connected to a straight edge of the first connection surface 131. A side of the third connection surface 133 is connected to the second surface 12, and a side of the third connection surface 133 away from the second surface 12 is connected to a straight edge of the first connection surface 131 away from the first surface 11. The third connection surface 133 intersects the second surface 12 to form a third included angle R3, and the third included angle R3 is an obtuse angle. The side surface 13 of the array substrate 1 having the curved surface structure can lower a stress during bending formation of the display panel 100 and effectively remove micro cracks generated on the display panel after cutting.

The bonding terminal 3 is disposed on a first surface 11 of the array substrate 1 and is located in the bonding region 102. The bonding terminal 3 is configured to electrically connect the array substrate 1 to an external driver element (for example, a chip on film). The thin film transistors in the array substrate 1 is electrically connected to the bonding terminal 3 through the signal wiring. The external driver element controls and driver signals to the thin film transistors for switch on or off through the bonding terminal 3 and the signal wirings.

The color filter substrate 2 is also disposed on the first surface 11 of the array substrate 1 and is located in the display region 101. The color filter substrate 2 generally comprises a color resist layer, a black matrix, etc. Backlight light through the array substrate 1 and liquid crystals becomes light of a specific color after filtered by the color resist layer to achieve color display. The black matrix is configured to prevent cross color of light between adjacent pixel units to further enhance contrast of display images.

The display panel 100 comprises a display surface 110 and a rear surface 120. A surface of the color filter substrate 2 away from the array substrate 1 is the display surface 110 of the display panel 100. The second surface 12 of the array substrate 1 is the rear surface 120 of the display panel 100. Light emitted by the backlight module enters the display panel 100 through the rear surface 120. The backlight light of a unified color after refraction and filtering of devices in the display panel 100, becomes light of colors and is emitted out from the display surface 110 to form the display images.

In the display region 101, the side surface 13 of the array substrate 1 is assembled with the side surface of the color filter substrate 2 to form the side surface of the display panel 100. Namely, a side of the side surface of the color filter substrate 2 near the array substrate 1 is jointed with a straight edge of the first connection surface 131 away from the third connection surface 133. A first included angle R1 is defined between the side surface of the color filter substrate 2 and the display surface 110, and the first included angle R1 is an acute angle or a right angle.

In the bonding region 102, the side surface 13 of the array substrate 1 is assembled with a side surface of the bonding terminal 3 to form the side surface of the display panel 100. Namely, a side of the side surface of the bonding terminal 3 near the array substrate 1 is jointed with a straight edge of the first connection surface 131 away from the third connection surface 133. A second included angle R2 is defined between the side surface of the bonding terminal 3 and a surface of the bonding terminal 3 away from the array substrate 1, and the second included angle R2 is an acute angle or a right angle.

Preferably, both the first included angle R1 and the second included angle R2 are right angles.

The display panel 100 further comprises a polarizer 4 and a side encapsulation layer 5. With reference to FIG. 6, the polarizer 4 is disposed on the surface of the color filter substrate 2 away from the array substrate 1, and a width of the polarizer 4 is greater than a width of the color filter substrate 2. The side encapsulation layer 5 is disposed in the display region 101 and covers the side surface 13 of the array substrate 1 and a side surface of the color filter substrate 2. The side encapsulation layer 5 and the color filter substrate 2 are commonly disposed on the same side of the polarizer 4, and a thickness of the side encapsulation layer 5 is less than or equal to a sum of a thickness of the array substrate 1 and a thickness of the color filter substrate 2. The side encapsulation layer 5 is configured to encapsulate the side surface of the display panel 100 to prevent water oxygen from invading through the side surface of the display panel 100 and improve a use lifespan of the display panel 100.

The embodiment of the present invention also provides a manufacturing method of a display panel 100 for manufacturing the above display panel 100. Specific processes of the manufacturing method are the same as those in the display panel manufacturing method provided by the first embodiment, and a difference is the grind device for grinding the display panel 100. The grind device used by the embodiment of the present invention has the grind head further comprising a third grinding surface. the third grinding surface corresponds to the third connection surface 133 of the array substrate 1 and is configured to grind the third connection surface 133 of the array substrate 1.

In the display panel 100 and the manufacturing method thereof provided by the embodiment of the present invention, grind shapes of the side surfaces 13 are changed, advantages of a curved surface (the side surface 13 of the array substrate 1) and a plane (the side surfaces 13 of the color filter substrate 2 and the bonding terminal 3) are combined, and the advantage of a plane is added while the advantage of the arc side surface 13 is reserved.

First, a surface of the bonding terminal 3 away from the array substrate 1 would not be contacted when the grind head 200 is grinded, which reduces a contact area between the bonding terminal 3 and the grind head and makes the bonding terminal 3 receive a force more evenly during grinding to prevent a metal material in the bonding terminal 3 from becoming particle foreign residues remaining in the display panel due to grinding, to further solve an issue shorting of conductive wirings in the display panel resulting from the metal foreign residues.

Second, a design of the plane side surface 13 of the color filter substrate 2 is reserved, which more facilitates flow and filling of a photosensitive glue material, solves the issue that in a conventional technology the photosensitive glue material cannot be filled into an arc gap and results in a side-coated white line, reduces an infiltrating time of the photosensitive glue material before the ultraviolet curing lamp arrives in, and improves a coating speed of the photosensitive glue material to improve production efficiency.

Fourth Embodiment

The embodiment of the present invention provides a display device. The display device is a curved liquid crystal display (LCD). The display device generally comprises a display panel 100 and a backlight module. The backlight module provides the display panel 100 with a display light source. The display device can be any display device including a display function such as a cell phone, a notebook, a tablet, or a television.

Figure 7:
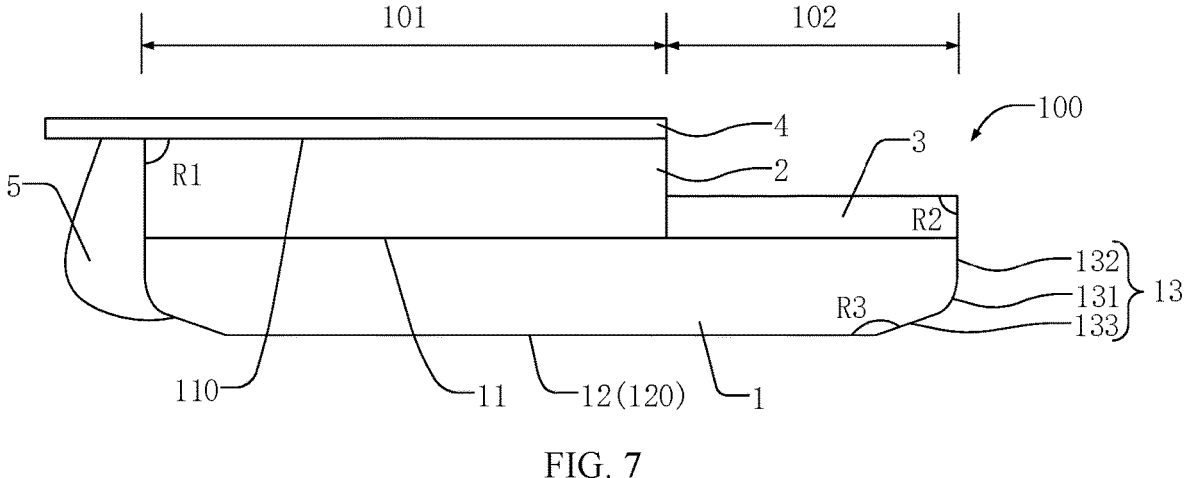
FIG. 7 is a schematic structural view of a lamination of the display panel of a fourth embodiment of the present invention.

With reference to FIG. 7, the display panel 100 comprises a display region 101 and a bonding region 102 connected to the display region 101. The display panel 100 comprises an array substrate 1, a color filter substrate 2, and a bonding terminal 3.

The array substrate 1 covers the display region 101 and the bonding region 102, and thin film transistors, signal wirings, etc. are generally disposed on the array substrate 1. The array substrate 1 comprises a first surface 11 and a second surface 12 disposed oppositely. The first surface 11 and the second surface 12 are connected to each other through a side surface 13. The thin film transistors are arranged in an array in the array substrate 1, and are located in the display region 101. The array substrate 1 controls an intensity of a driving electrical field through the thin film transistors to control rotation angles of liquid crystals in the display panel 100, and to further control a light transmittance of each pixel unit such that the display panel 100 can display different images.

The side surface 13 of the array substrate 1 comprises a first connection surface 131, a second connection surface 132, and a third connection surface 133. The first connection surface 131 is curved surface. Both the second connection surface 132 and the third connection surface 133 are planes. The curved surface can be circular arc-shaped, elliptical arc-shaped, or is a combination of at least two arc surfaces with different circle centers, and a radian of the curved surface is less than or equal to 90°. The first connection surface 131 comprise two straight edges s disposed oppositely. The second connection surface 132 is connected to a straight edge of the first connection surface 131 near the first surface 11. The third connection surface 133 is connected to a straight edge of the first connection surface 131 near the second surface 12. A side of the second connection surface 132 away from the first connection surface 131 is connected to the first surface 11. A side of the third connection surface 133 away from the first connection surface 131 is connected to the second surface 12. Furthermore, the third connection surface 133 intersects the second surface 12 to form a third included angle R3, and the third included angle R3 is an obtuse angle. Preferably, both the second connection surface 132 and the third connection surface 133 are tangent to the first connection surface 131 such that a junction of the second connection surface 132 and the third connection surface 133 with the first connection surface 131 is more natural and smooth. The side surface 13 of the array substrate 1 having the curved surface structure can lower a stress during bending formation of the display panel 100 and effectively remove micro cracks generated on the display panel after cutting.

The bonding terminal 3 is disposed on a first surface 11 of the array substrate 1 and is located in the bonding region 102. The bonding terminal 3 is configured to electrically connect the array substrate 1 to an external driver element (for example, a chip on film). The thin film transistors in the array substrate 1 is electrically connected to the bonding terminal 3 through the signal wiring. The external driver element controls and driver signals to the thin film transistors for switch on or off through the bonding terminal 3 and the signal wirings.

The color filter substrate 2 is also disposed on the first surface 11 of the array substrate 1 and is located in the display region 101. The color filter substrate 2 generally comprises a color resist layer, a black matrix, etc. Backlight light through the array substrate 1 and liquid crystals becomes light of a specific color after filtered by the color resist layer to achieve color display. The black matrix is configured to prevent cross color of light between adjacent pixel units to further enhance contrast of display images.

The display panel 100 comprises a display surface 110 and a rear surface 120. A surface of the color filter substrate 2 away from the array substrate 1 is the display surface 110 of the display panel 100. The second surface 12 of the array substrate 1 is the rear surface 120 of the display panel 100. Light emitted by the backlight module enters the display panel 100 through the rear surface 120. The backlight light of a unified color after refraction and filtering of devices in the display panel 100, becomes light of colors and is emitted out from the display surface 110 to form the display images.

In the display region 101, the side surface 13 of the array substrate 1 and the side surface of the color filter substrate 2 are assembled to form the side surface of the display panel 100, namely a side of the side surface of the color filter substrate 2 near the array substrate 1 is jointed with a side of the second connection surface 132 away from the first connection surface 131. The side surface of the color filter substrate 2 is tangent to the first connection surface 131, namely, the side surface of the color filter substrate 2 and the second connection surface 132 are in a same plane. A first included angle R1 is defined between the side surface of the color filter substrate 2 and the display surface 110, and the first included angle R1 is an acute angle or a right angle.

In the bonding region 102, the side surface 13 of the array substrate 1 is assembled with a side surface of the bonding terminal 3 to form the side surface of the display panel 100. Namely, a side of the side surface of the bonding terminal 3 near the array substrate 1 is jointed with a side of the second connection surface 132 away from the first connection surface 131. The side surface of the bonding terminal 3 is tangent to the second connection surface 132, namely, the side surface of the bonding terminal 3 and the second connection surface 132 are in a same plane. A second included angle R2 is defined between the side surface of the bonding terminal 3 and a surface of the bonding terminal 3 away from the array substrate 1, and the second included angle R2 is an acute angle or a right angle.

Preferably, both the first included angle R1 and the second included angle R2 are right angles. At this time, the radian of the first connection surface 131 is less than 90°.

The display panel 100 further comprises a polarizer 4 and a side encapsulation layer 5. With reference to FIG. 7, the polarizer 4 is disposed on the surface of the color filter substrate 2 away from the array substrate 1, and a width of the polarizer 4 is greater than a width of the color filter substrate 2. The side encapsulation layer 5 is disposed in the display region 101 and covers the side surface 13 of the array substrate 1 and a side surface of the color filter substrate 2. The side encapsulation layer 5 and the color filter substrate 2 are commonly disposed on the same side of the polarizer 4, and a thickness of the side encapsulation layer 5 is less than or equal to a sum of a thickness of the array substrate 1 and a thickness of the color filter substrate 2. The side encapsulation layer 5 is configured to encapsulate the side surface of the display panel 100 to prevent water oxygen from invading through the side surface of the display panel 100 and improve a use lifespan of the display panel 100.

The embodiment of the present invention also provides a manufacturing method of a display panel 100 for manufacturing the above display panel 100. Specific processes in the manufacturing method are the same as those of the display panel manufacturing method provided by the second embodiment, and a difference is the grind device for grinding the display panel 100. The grind device used in the embodiment of the present invention has the grind head comprising a third grinding surface. The third grinding surface corresponds to a third connection surface 133 of the array substrate 1 and is configured to grind the third connection surface 133 of the array substrate 1.

In the display panel and the manufacturing method thereof provided by the embodiment of the present invention, grind shapes of the side surfaces are changed, advantages of a curved surface (the side surface of the array substrate) and a plane (the side surfaces of the color filter substrate and the bonding terminal) are combined, and the advantage of a plane is added while the advantage of the arc side surface is reserved.

First, a surface of the bonding terminal away from the array substrate would not be contacted when the grind head is grinded, which reduces a contact area between the bonding terminal and the grind head and makes the bonding terminal receive a force more evenly during grinding to prevent a metal material in the bonding terminal from becoming particle foreign residues remaining in the display panel due to grinding, to further solve an issue shorting of conductive wirings in the display panel resulting from metal foreign residues.

Second, a design of the plane side surface of the color filter substrate is reserved, which more facilitates flow and filling of a photosensitive glue material, solves the issue that in a conventional technology the photosensitive glue material cannot be filled into an arc gap and results in a side-coated white line, reduces an infiltrating time of the photosensitive glue material before the ultraviolet curing lamp arrives in, and improves a coating speed of the photosensitive glue material to improve production efficiency.

Although the present invention is described with reference to specific implementations in this specification, it should be understood that these embodiments are merely examples of the principles and applications of the present invention. Therefore, it should be understood that many exemplary embodiments can be modified, and other arrangements can be designed, as long as they do not deviate from the spirit and range of the present invention defined by the appended claims. It should be understood that different dependent claims and the features in the specification can be combined in ways different from those described in the original claims. It is also understood that the features described in combination with a separate embodiment can be used in other the embodiment.

What is claimed is:

1. A display panel, comprising a display region and a bonding region connected to the display region, and the display panel comprising a display surface; wherein the display panel comprises:

an array substrate comprising a first surface and a second surface disposed oppositely, and a side surface connecting the first surface and the second surface;

a color filter substrate disposed on the first surface of the array substrate and located in the display region; and a bonding terminal disposed on the first surface of the array substrate and located in the bonding region;

wherein a side surface of the color filter substrate intersects a surface of the color filter substrate away from the array substrate to form a first included angle, and the first included angle is an acute angle or a right angle;

wherein the side surface of the array substrate further comprises a first connection surface, wherein the first connection surface is a curved surface, and the first surface and the second surface are connected to straight edges of the side surface of the array substrate.

2. The display panel according to claim 1, wherein a side surface of the bonding terminal intersects a surface of the bonding terminal away from the array substrate to form a second included angle, and the second included angle is an acute angle or a right angle.

3. The display panel according to claim 1, wherein the side surface of the array substrate further comprises:

a second connection surface being a plane and disposed at an end of the first connection surface near the first surface;

wherein an end of the second connection surface is connected to the display surface, and another end of the second connection surface is connected to a straight edge of the first connection surface;

wherein the second connection surface and the side surface of the color filter substrate and/or a side surface of the bonding terminal are in a same plane.

4. The display panel according to claim 1, wherein the side surface of the color filter substrate and a side surface of the bonding terminal are tangent to the first connection surface.

5. The display panel according to claim 1, wherein the side surface further comprises:

a third connection surface being a plane, and is disposed at an end of the first connection surface near the second surface;

wherein an end of the third connection surface is connected to the second surface, and another end of the third connection surface is connected to a straight edge of the first connection surface;

wherein the third connection surface intersects the second surface to form a third included angle, and the third included angle is an obtuse angle.

6. The display panel according to claim 5, wherein the third connection surface is tangent to the first connection surface.

7. The display panel according to claim 1, wherein the curved surface is a circular arc surface or an elliptical circular arc surface, or is formed by a combination of at least two arc surfaces with different circle centers.

8. The display panel according to claim 1, wherein further comprises:

a side encapsulation layer disposed on the array substrate and the side surface of the color filter substrate and located in the display region; and a polarizer disposed on the surface of the color filter substrate away from the array substrate.

9. A display panel, comprising a display region and a bonding region connected to the display region, and the display panel comprising a display surface; wherein the display panel comprises:

an array substrate comprising a first surface and a second surface disposed oppositely, and a side surface connecting the first surface and the second surface;

a color filter substrate disposed on the first surface of the array substrate and located in the display region; and a bonding terminal disposed on the first surface of the array substrate and located in the bonding region;

wherein a side surface of the color filter substrate intersects a surface of the color filter substrate away from the array substrate to form a first included angle, and the first included angle is an acute angle or a right angle;

wherein the side surface of the array substrate further comprises a first connection surface, wherein the first connection surface is a curved surface, and the first surface and the second surface are connected to straight edges of the side surface of the array substrate;

wherein the side surface of the array substrate further comprises a second connection surface being a plane and disposed at an end of the first connection surface near the first surface;

wherein an end of the second connection surface is connected to the display surface, and another end of the second connection surface is connected to a straight edge of the first connection surface;

wherein the second connection surface and the side surface of the color filter substrate and/or a side surface of the bonding terminal are in a same plane;

wherein the side surface of the color filter substrate and a side surface of the bonding terminal are tangent to the first connection surface.

10. The display panel according to claim 9, wherein a side surface of the bonding terminal intersects a surface of the bonding terminal away from the array substrate to form a second included angle, and the second included angle is an acute angle or a right angle.

11. The display panel according to claim 9, wherein the side surface further comprises:

a third connection surface being a plane, and is disposed at an end of the first connection surface near the second surface;

wherein an end of the third connection surface is connected to the second surface, and another end of the third connection surface is connected to a straight edge of the first connection surface;

wherein the third connection surface intersects the second surface to form a third included angle, and the third included angle is an obtuse angle.

12. The display panel according to claim 11, wherein the third connection surface is tangent to the first connection surface.

13. The display panel according to claim 9, wherein the curved surface is a circular arc surface or an elliptical circular arc surface, or is formed by a combination of at least two arc surfaces with different circle centers.

14. The display panel according to claim 9, wherein further comprises:

a side encapsulation layer disposed on the array substrate and the side surface of the color filter substrate and located in the display region; and a polarizer disposed on the surface of the color filter substrate away from the array substrate.

15. A display panel, comprising a display region and a bonding region connected to the display region, and the display panel comprising a display surface; wherein the display panel comprises:

an array substrate comprising a first surface and a second surface disposed oppositely, and a side surface connecting the first surface and the second surface;

a color filter substrate disposed on the first surface of the array substrate and located in the display region; and a bonding terminal disposed on the first surface of the array substrate and located in the bonding region;

wherein a side surface of the color filter substrate intersects a surface of the color filter substrate away from the array substrate to form a first included angle, and the first included angle is an acute angle or a right angle;

wherein the side surface of the array substrate further comprises a first connection surface, wherein the first connection surface is a curved surface, and the first surface and the second surface are connected to straight edges of the side surface of the array substrate;

wherein the side surface of the color filter substrate and a side surface of the bonding terminal are tangent to the first connection surface;

wherein the curved surface is a circular arc surface or an elliptical circular arc surface, or is formed by a combination of at least two arc surfaces with different circle centers.

16. The display panel according to claim 15, wherein the side surface of the array substrate further comprises:

a second connection surface being a plane and disposed at an end of the first connection surface near the first surface;

wherein an end of the second connection surface is connected to the display surface, and another end of the second connection surface is connected to a straight edge of the first connection surface;

wherein the second connection surface and the side surface of the color filter substrate and/or a side surface of the bonding terminal are in a same plane.

17. The display panel according to claim 15, wherein the side surface further comprises:

a third connection surface being a plane, and is disposed at an end of the first connection surface near the second surface;

wherein an end of the third connection surface is connected to the second surface, and another end of the third connection surface is connected to a straight edge of the first connection surface;

wherein the third connection surface intersects the second surface to form a third included angle, and the third included angle is an obtuse angle.

* * * * *